United States Patent [19]

Maekawa et al.

[11] Patent Number: 5,748,026

[45] Date of Patent: May 5, 1998

[54] CIRCUIT FOR CONVERTING LEVEL OF LOW-AMPLITUDE INPUT

[75] Inventors: Toshikazu Maekawa; Yuji Hayashi, both of Kanagawa, Japan

[73] Assignee: Sony Corporation, Tokyo, Japan

[21] Appl. No.: 796,039

[22] Filed: Feb. 5, 1997

Related U.S. Application Data

[63] Continuation of Ser. No. 524,782, Sep. 7, 1995, abandoned, which is a continuation of Ser. No. 156,838, Nov. 24, 1993, abandoned.

[30] Foreign Application Priority Data

Nov. 25, 1992 [JP] Japan ..................... 4-338123
Jun. 25, 1993 [JP] Japan ..................... 5-180788

[51] Int. Cl.[6] ........................... H03K 19/0185
[52] U.S. Cl. .................. 327/333; 327/306; 327/178; 326/68
[58] Field of Search .................. 307/493, 475; 327/333, 307, 306, 315, 179, 178, 206, 205, 219, 220; 326/80, 68, 98

[56] References Cited

U.S. PATENT DOCUMENTS

| 3,684,900 | 8/1972 | Greuter et al. | 327/220 |
| 4,091,296 | 5/1978 | Suzuki et al. | 327/220 |
| 4,137,469 | 1/1979 | Chapron | 327/205 |
| 4,567,380 | 1/1986 | Yasuda et al. | 327/205 |
| 4,767,951 | 8/1988 | Cornish et al. | 307/475 |
| 5,012,137 | 4/1991 | Muellner | 307/475 |
| 5,075,581 | 12/1991 | Kamaja | 307/475 |
| 5,191,233 | 3/1993 | Nakano | 307/475 |
| 5,283,482 | 2/1994 | Chen | 307/475 |
| 5,298,808 | 3/1994 | Terrell et al. | 326/68 |
| 5,332,935 | 7/1994 | Shyu | 326/73 |
| 5,646,642 | 7/1997 | Maekawa et al. | 327/333 |

FOREIGN PATENT DOCUMENTS 0 235 499  9/1987  European Pat. Off. .

OTHER PUBLICATIONS

Ben G. Streetman, *Solid State Electronic Devices*, second edition, 1980, pp. 331–332.
Paul M. Chirlian, *Analysis and Design of Integrated Electronic Circuits*, 1991, pp. 692–695.

Primary Examiner—Timothy P. Callahan
Assistant Examiner—Terry L. Englund
Attorney, Agent, or Firm—Hill & Simpson

[57] ABSTRACT

A level converting circuit for an input clock signal having a relatively low amplitude comprising a level converting circuit for converting the input clock signal to an output clock signal having a relatively high amplitude, the level converting circuit having an input transistor which has a predetermined threshold voltage, and detecting/offsetting circuit for detecting the threshold voltage of the input transistor and adding an offset voltage in response to the detected threshold voltage to the input clock signal and then for providing the offset input clock signal to the level converting circuit. The novel setup performs clock interfacing of a thin-film transistor integrated circuit device represented by an active-matrix liquid crystal display device at a relatively high speed at a low voltage below 3 V for example. This allows to fully cope with a recent trend of ever reducing operating voltage of a CMOS gate array constituting an external timing generator, eliminating necessity for building a pulse amplifier based especially on high dielectric-strength MOS process into the gate array to eventually reduce size of the chip.

10 Claims, 10 Drawing Sheets

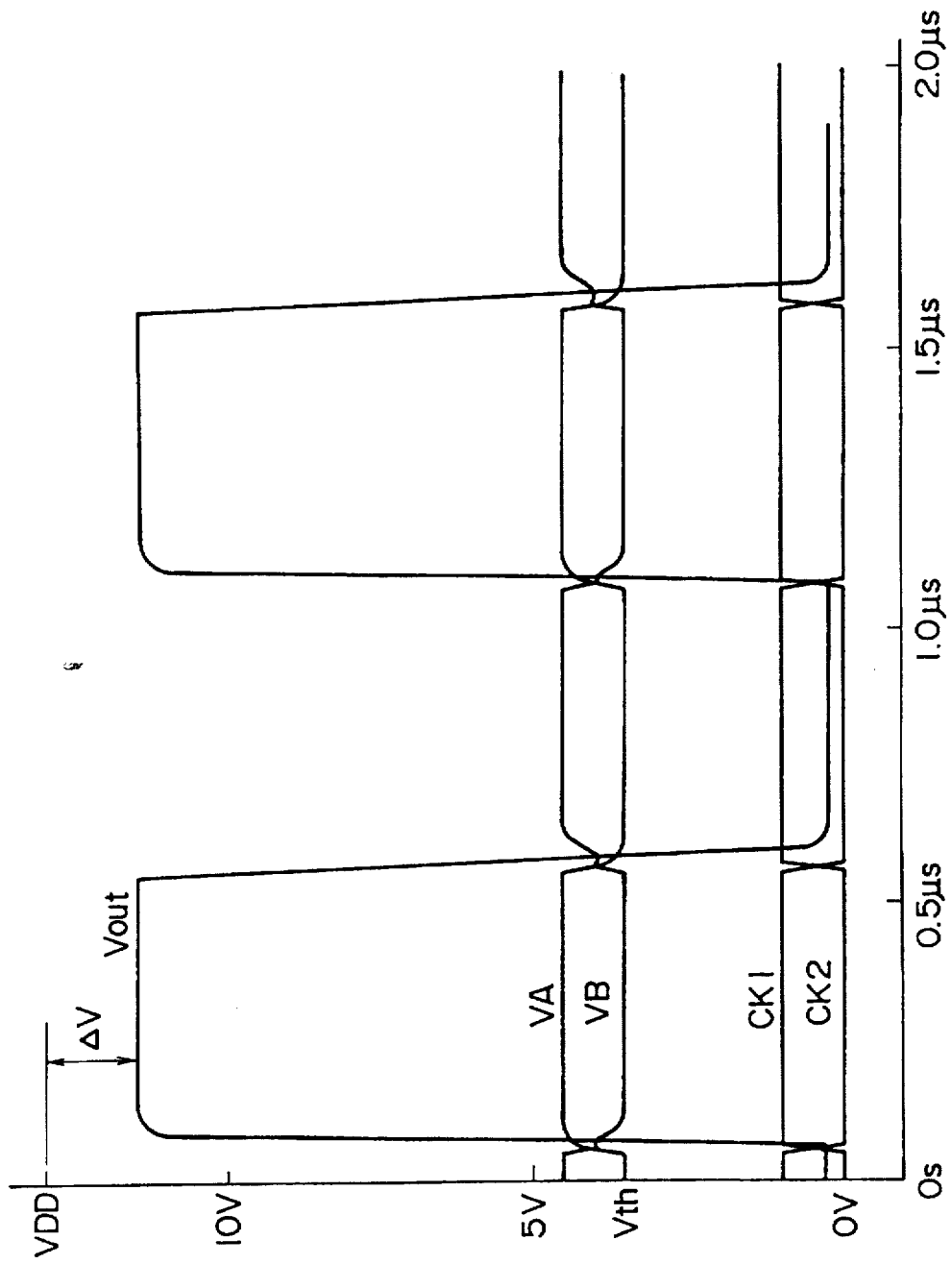

F I G. 3(a)
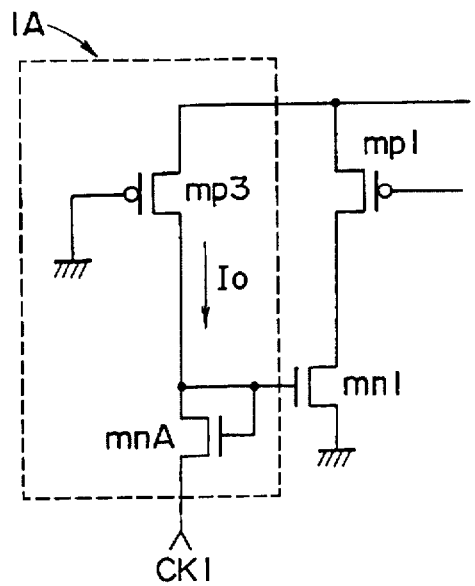
F I G. 3(b)
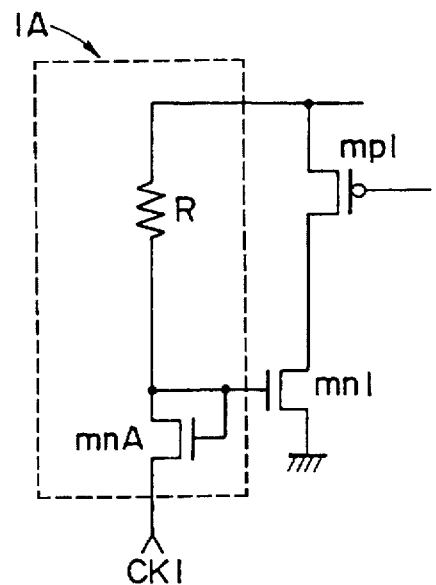
F I G. 4
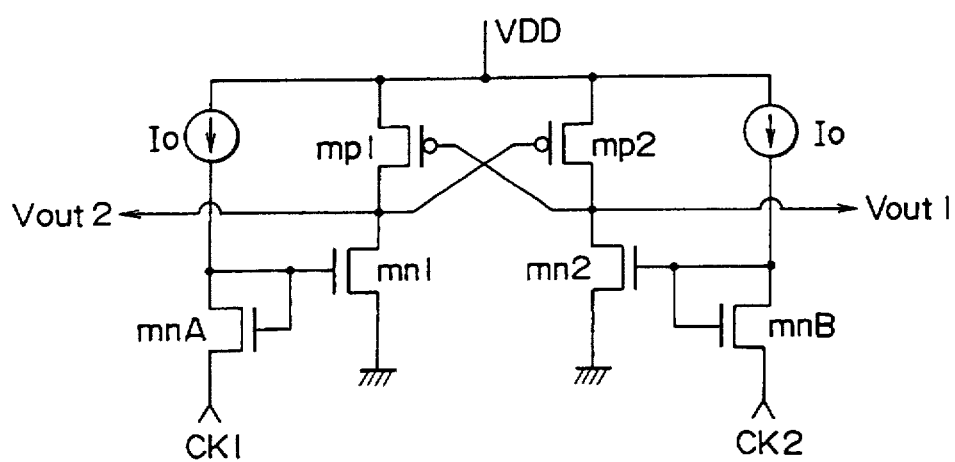

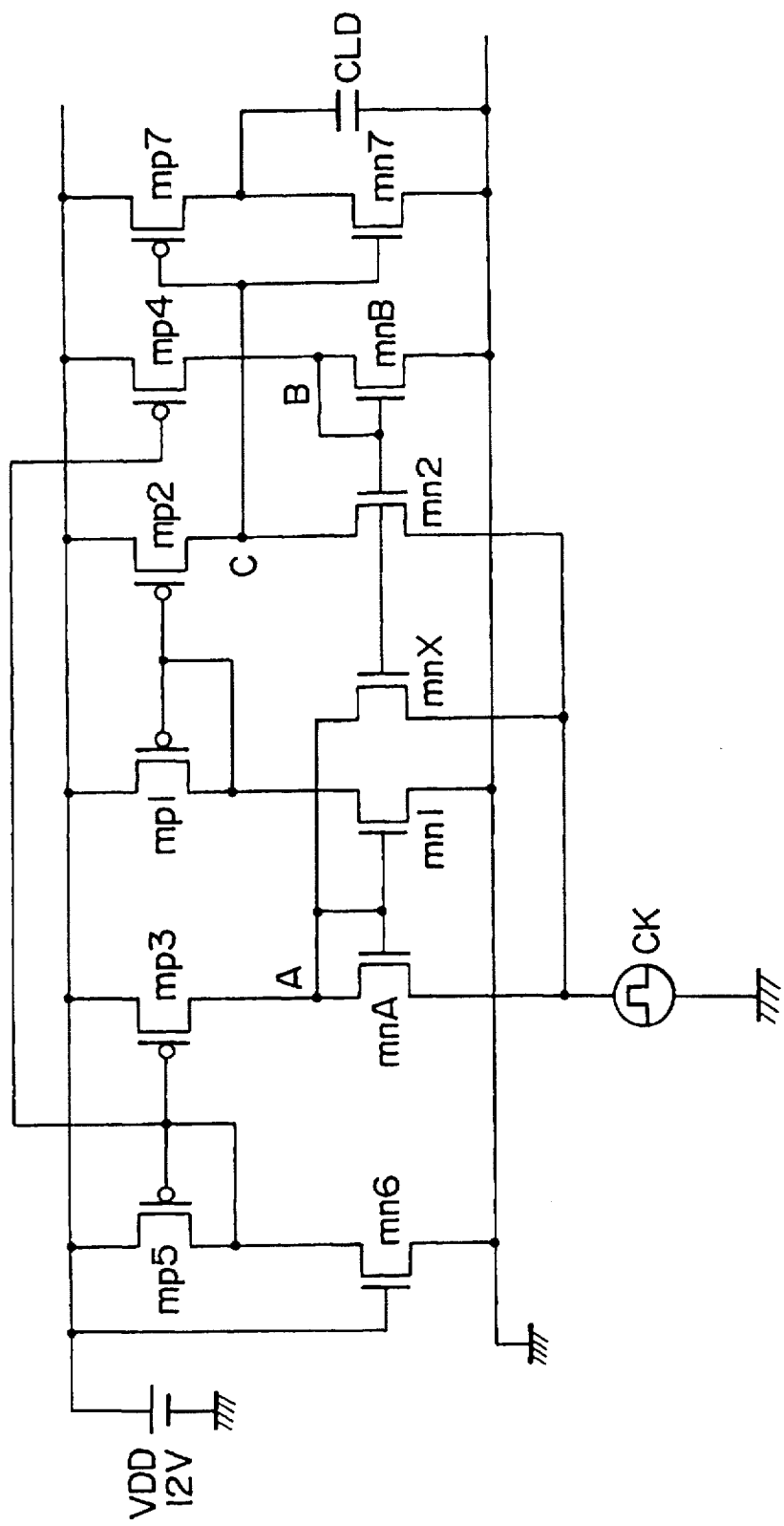
F I G. 12

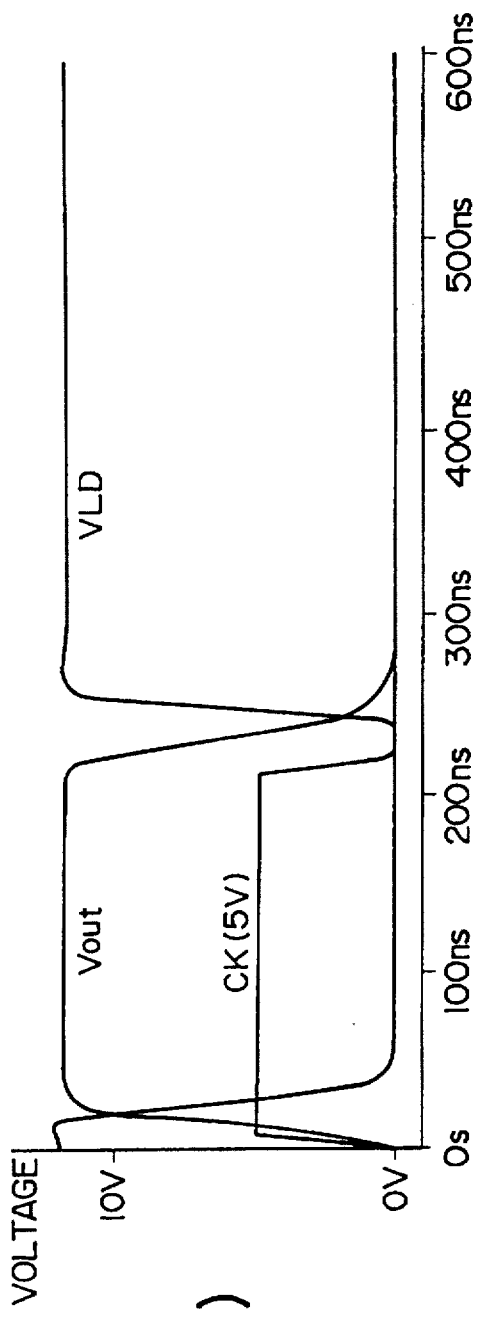
F I G. 13(1)
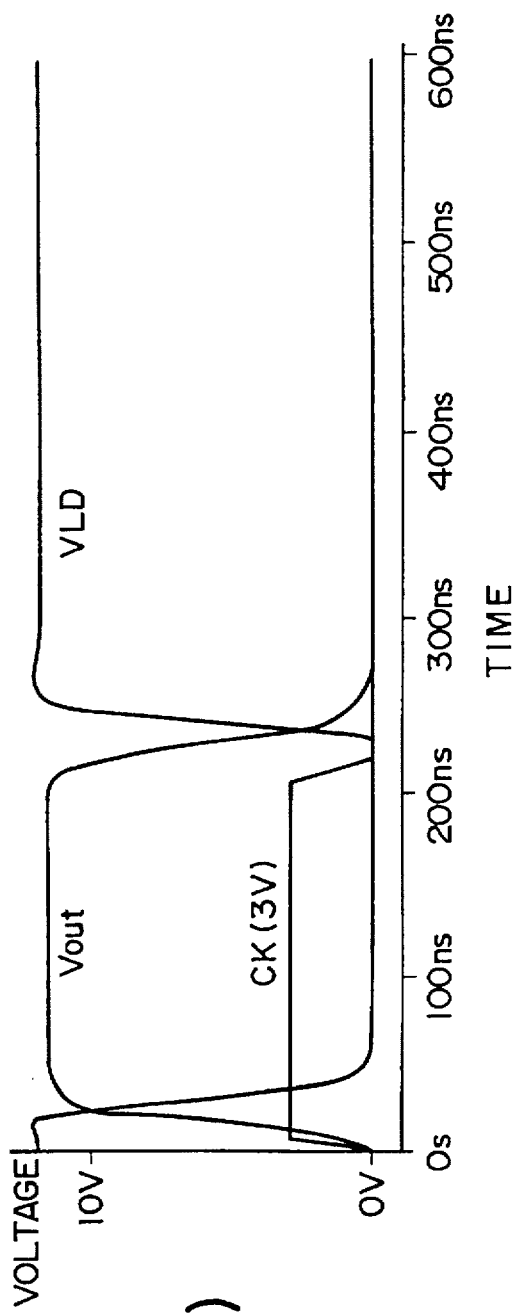
F I G. 13(2)

CIRCUIT FOR CONVERTING LEVEL OF LOW-AMPLITUDE INPUT

This is a continuation of application Ser. No. 08/524,782, filed Sep. 7, 1995, which is a continuation of Ser. No. 08/156,838, filed Nov. 24, 1993, both application are now abandoned. Also, U.S. Pat. No. 5,646,642 (issued Jul. 8, 1997) is a division of parent application Ser. No. 08/156, 838.

BACKGROUND OF THE INVENTION

1. Field of the Invention

The present invention relates to a level converting circuit and, more particularly, to a circuit for converting a low-amplitude input which, built in a thin-film transistor integrated circuit or the like, functions as its clock interface and pulse-amplifies a low-amplitude input clock signal.

2. Description of the Related Art

FIG. 7 shows an example of a conventional level converting circuit. This level converting circuit 101 is built in a thin-film transistor (TFT) integrated circuit 102 to function as its clock interface. The level converting circuit 101 comprises a current mirror circuit containing a pair of input transistors mn1 and mn2 and a pair of load transistors mp1 and mp2. Each of the input transistors is the thin-film transistor of n-channel field-effect transistor (FET) type. Each of the load transistors is the thin-film transistor of p-channel FET type. Gates of the pair of input transistors mn1 and mn2 are supplied with a clock signal CK1 and a clock signal CK2 respectively. These clock signals are opposite to each other in phase. The current mirror circuit is applied with a supply voltage VDD to output a pulse-amplified output clock signal Vout in response to the input clock signals CK1 and CK2. The output clock signal Vout is used as an internal clock of the thin-film transistor integrated circuit 102. The thin-film transistor integrated circuit 102 has a relatively high operating voltage, the supply voltage VDD being about 11 V to 14 V for example. The pair of input clock signals CK1 and CK2 are supplied from a timing generator (TG) 103. The timing generator 103 is generally composed of a CMOS gate array formed on a silicon chip, its supply voltage being relatively low.

Referring to FIG. 8, a problem to be solved by the invention will be briefly described. As shown on FIG. 8(a) the conventional level converting circuit 101 pulse-amplifies the output clock signal Vout in response to the input clock signal CK1. At this time, an amplitude (a peak potential) of the input clock signal CK1 needs to be somewhat higher than a threshold value Vth of the input transistor mn1. For example, if the threshold value Vth is 3 V, the peak potential of the input clock signal needs to be 4 V or higher. As shown in FIG. 8(b), if the peak potential of the input clock signal CK1 is lower than the threshold value Vth, the input transistor mn1 does not conduct sufficiently, providing no proper output clock signal Vout.

The external timing generator 103, which supplies the input clock signal, is made up of a CMOS gate array in general. Recently, a supply voltage necessary for driving the gate array has been lowering from conventional 5 V to 3.3 V or lower. A clock signal supplied by such a low-voltage timing generator as mentioned above is sometimes lower than the TFT threshold value on the thin-film transistor integrated circuit. This problem makes it very difficult for directly interfacing between the low-voltage CMOS gate array and the thin-film transistor integrated circuit.

In a conventional example shown in FIG. 7, the level converting circuit is operated by using two-phase input clocks CK1 and CK2 opposite to each other in polarity. This consequently requires a pair of connecting terminals at the clock interface. As the number of necessary internal clocks increases, the number of clock interface connecting terminals increases, complicating a wiring job and preventing compact device packaging. To solve these problems, a level converting circuit which operates on a single-phase input clock signal has been proposed. FIG. 9 shows an example of such a circuit. Basically, this circuit has generally the same constitution as that of the two-phase input level converting circuit shown in FIG. 7. In the figure, common parts are assigned with common reference numerals for ease of understanding. The single-phase input level converting circuit is different from the single-phase counterpart in that a gate of the input transistor mn2 is supplied with a fixed DC bias VG instead of the inverted input clock signal CK2.

Referring to FIG. 10, operation of the single-phase input level converting circuit of FIG. 9 will be described briefly. When the input clock signal CK goes high, the input transistor mn1 and the load transistor mp2 conduct, upon which the pulse-amplified output clock signal Vout rises. Then, when the input clock signal CK goes low, the load transistor mp2 stops conducting and, at the same time, the input transistor mn2 applied with the fixed bias VG operates, causing the output clock signal Vout to fall. To perform this operation stably, it is necessary to properly set the fixed bias VG based on the peak potential of the input clock signal CK and the threshold voltage of the input transistor mn2. Actually, however, it is extremely difficult to set the fixed bias VG in an internal circuit approach. Also, even if the fixed bias VG is externally applied, very fine adjustment is required, thereby hampering practicality. Like the two-phase input level converting circuit of FIG. 7, the single-phase input level converting circuit of FIG. 9 cannot provide the proper output clock signal Vout if the peak potential of the input clock signal goes below the threshold voltage of the input transistor.

OBJECTS AND SUMMARY OF THE INVENTION

It is therefore an object of the present invention to provide a level converting circuit which operates stably for any of a two-phase and a single-phase input clock signals having a relatively low amplitude.

In carrying out the invention and according to one aspect thereof, there is provided a circuit for converting an input level having a low amplitude comprising a detecting/offsetting block disposed in a front stage therein and a level converting block disposed in a rear stage therein. The level converting block includes an input transistor having a predetermined threshold value and amplifies an input signal having a relatively low amplitude to an output clock signal having a relatively high amplitude. The detecting/offsetting block detects the threshold value of the above-mentioned input transistor, adds an offset according to the threshold value to the input clock signal, and supplies a resultant signal to the above-mentioned level converting block.

According to one mode of the invention, the above-mentioned detecting/offsetting block comprises sensing element for sensing the threshold value of the input transistor to add an offset according to the sensed threshold value to the input clock signal. The sensing element in turn comprises a sensing transistor formed to have a threshold value equivalent to the threshold value of the input transistor. An offset according to a threshold level voltage produced between a source and gate of the sensing transistor is applied to the input clock signal. The detecting/offsetting block is also provided with a current source for driving this sensing transistor. The current source comprises, for example, a transistor or a resistor connected in series between a supply line and the sensing transistor. Preferably, the above-mentioned level converting block includes a pair of input transistors which receive at their gates two-phase input clocks having opposite phases. The input clock signal to be supplied to the gate of one input transistor is also supplied to a source of the other input transistor. The level converting block having the above-mentioned constitution comprises a current mirror circuit for example. Alternatively, a flip-flop circuit is used for the level converter.

The present invention is not limited to the above-mentioned two-phase level converting circuit; it can also be applied to a single-phase input level converting circuit. That is, according to another mode of the invention, the level converting block includes a pair of input transistors. A gate of one input transistor is applied with a single-phase input clock signal with a predetermined offset added by a corresponding sensing element. A gate of the other input transistor is applied directly with the predetermined offset via a corresponding sensing element. In this case, the single-phase input clock signal to be supplied to the gate of one input transistor is also supplied to the source of the other input transistor. This constitution includes an auxiliary element for lowering a driving capacity of one input transistor than that of the other input transistor when the single-phase input clock signal switches to zero level, thereby stabilizing inversion of an output clock signal. The above-mentioned auxiliary element is composed of an auxiliary transistor whose source and drain are connected to the source of the above-mentioned one input transistor and the gate of the other above-mentioned input transistor respectively. A gate of the auxiliary transistor is commonly connected to the gate of the other above-mentioned input transistor.

The low-amplitude input level converting circuit according to the invention is contained in a thin-film transistor integrated circuit device for example to function as its clock interface. For example, as such a thin-film transistor integrated circuit device, there is an active-matrix liquid crystal display device comprising an active-matrix display containing liquid crystal elements and thin-film transistors for driving the elements, a peripheral driving circuit containing a horizontal shift register for controlling supply of an image signal to these thin-film transistors and a vertical shift register for supplying a select signal, and the low-amplitude input level converting circuit for supplying an input clock signal to these registers, all the circuits formed on a single substrate. In this case, the low-amplitude input level converting circuit is formed by integrating field-effect thin-film transistors. It should be noted that the present invention is not limited to the field-effect thin-film transistor; it also applies to a MOS transistor using bulk silicon or a transistor whose semiconducting material is GaAs.

According to the present invention, the low-amplitude input clock signal is internally offset to a proper level based on a threshold of the thin-film transistor; then a resultant signal is level-converted. While the conventional constitution requires an input clock signal amplitude higher than the threshold level, the constitution according to the invention sufficiently allows a pulse amplifying operation at peak potential below the threshold level. Therefore, the low-amplitude input level converting circuit according to the invention directly provides clock interface even for a timing generator comprising a low-power operating CMOS gate array. Additionally, this invention is applicable to not only a two-phase input level converting circuit but also a single-phase input level converting circuit. When the invention is used as the clock interface, the number of connecting terminals is reduced with advantage.

BRIEF DESCRIPTION OF THE DRAWINGS

The above and other objects, features and advantages of the present invention will become more apparent from the following description taken in connection with the accompanying drawings, in which:

FIG. 2 is a waveform diagram illustrating a simulation result of the embodiment of FIG. 1;

FIGS. 3(a)–3(b) are diagrams illustrating a constitution of a detecting/offsetting circuit to be built in the embodiment of FIG. 1;

FIG. 4 is a circuit diagram of the low-amplitude input level converting circuit practiced as a second embodiment of the invention;

FIG. 12 is a circuit diagram of an example of a particular circuit constitution of the embodiment of FIG. 11; and FIG. 13(1) and 13(2) are waveform diagrams illustrating a simulation result of the embodiment of FIG. 12.

DESCRIPTION OF THE PREFERRED EMBODIMENTS

This invention will be described in further detail by way of preferred embodiments thereof with reference to the accompanying drawings.

Figure 1:
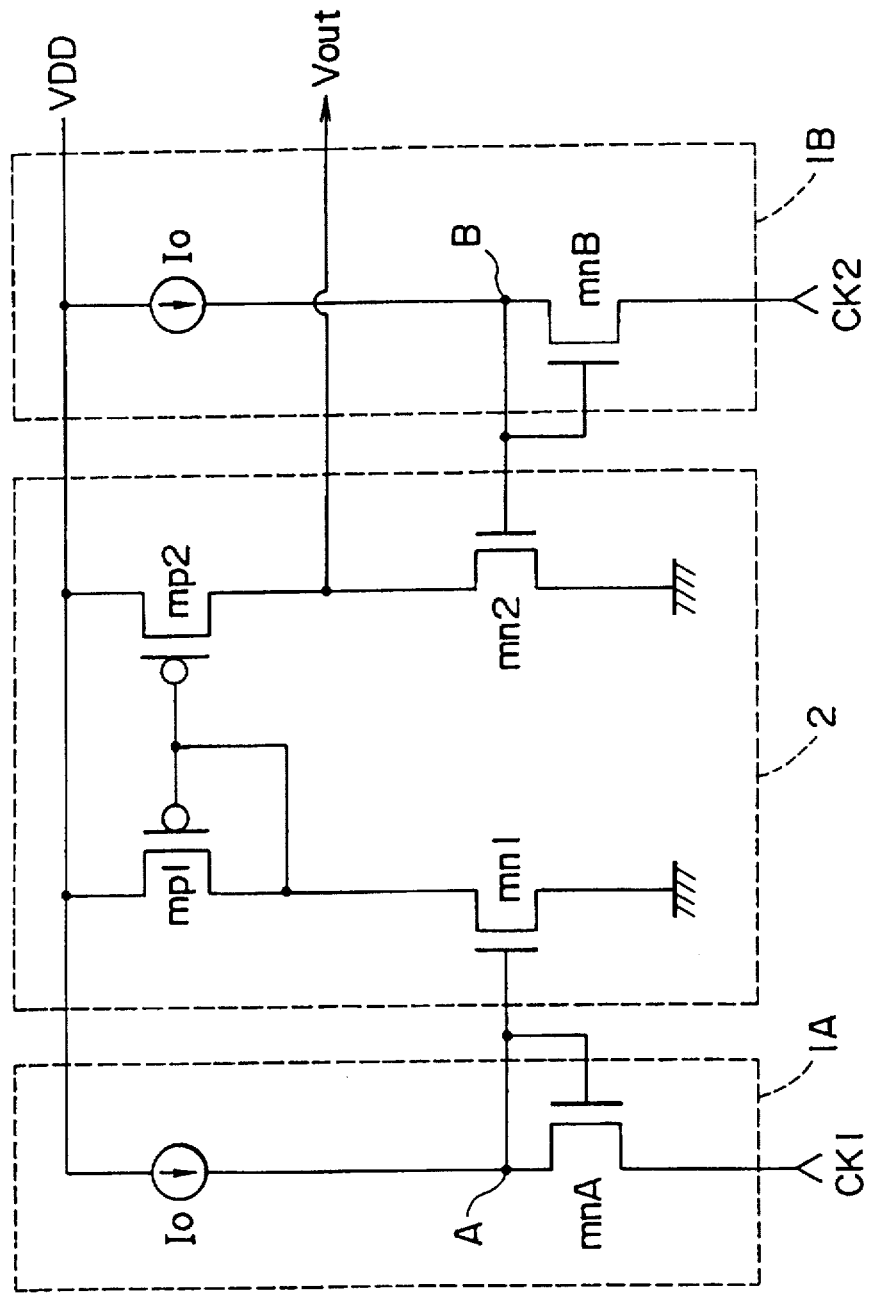
FIG. 1 is a circuit diagram of a low-amplitude input level converting circuit practiced as a first embodiment of the invention.

FIG. 1 is a low-amplitude input level converting circuit practiced as a first preferred embodiment of the invention. As shown, the level converting circuit according to the invention comprises detecting/offsetting circuits 1A and 1B disposed in a front stage therein and a level shifting circuit 2 (a level converting block) disposed in a rear stage therein. The level shifting circuit 2 contains an input transistor mn1 having a predetermined threshold value Vth and operates to amplify an input clock signal CK1 having a relatively low amplitude up to an output clock signal Vout having a relatively high amplitude. It should be noted that, in the first embodiment, the input transistor mn1 is composed of a n-channel field-effect type thin-film transistor. The detecting/offsetting circuit 1A detects the threshold value Vth of the input transistor mn1, adds an offset based on the detected Vth to the input clock signal CK1, and supplies a resultant signal to the level shifting circuit 2. This detecting/offsetting circuit 1A is provided with a detecting element. The detecting element is in turn provided with a detecting transistor mnA formed to have a threshold value substantially equal to that of the above-mentioned input transistor mn1. The detecting element adds an offset based on a voltage of a threshold level produced between a source and a gate of the transistor to the input clock signal CK1. The detecting element is also provided with a current source Io for driving the detecting transistor mnA. This transistor is composed of a n-channel field-effect type thin-film transistor whose drain and gate are connected to each other and to a gate of the corresponding input transistor mn1. The source of the detecting transistor mnA is supplied with the input clock signal CK1. The detecting transistor mnA conducts when the voltage between the source and the gate exceeds the threshold, causing the current source Io to flow a current. When the current flows, a potential at node A drops, making the detecting transistor mnA stop conducting. Consequently, in a normal state, the voltage between the source and the gate of the detecting transistor mnA is kept at the threshold voltage plus something. Since the threshold value of the detecting transistor has been set to be substantially equal to that of the input transistor mn1, the threshold value of the input transistor mn1 has been detected as a result. As apparently seen from FIG. 1, the gate of the input transistor mn1 is always applied with a bias of the threshold value Vth plus something, so that a DC offset according to this bias is added to the input clock signal CK1.

In the above-mentioned first embodiment, the level shifting circuit 2 comprises a current mirror circuit containing a pair of input transistors mn1 and mn2 and a pair of load transistors mp1 and mp2. Like the input transistor mn1, the input transistor mn2 is composed of a n-channel field-effect type thin-film transistor and is connected to the corresponding detecting/offsetting circuit 1B. The load transistors mp1 and mp2 are each composed of a p-channel field-effect type thin-film transistor. The pair of input transistors mn1 and mn2 are respectively supplied with the offset input clock signals CK1 and CK2 which are opposite to each other in phase via the corresponding detecting/offsetting circuits 1A and 1B. When the clock signal CK1 goes high, the corresponding input transistor mn1 conducts and then the load transistor mp2 also conducts in response. Consequently, a drain of this transistor rises toward a supply voltage VDD side to provide an amplified output clock signal Vout. After a predetermined hold time, the pair of input clock signals are inverted. When the input transistor mn2 conducts through a detecting transistor mnB, a drain of the input transistor mn2 is pulled up to a ground (GND) side, causing the output clock signal Vout to FIG. 2 is a waveform diagram in dicating a result of simulation performed on the low-amplitude input level converting circuit of FIG. 1. A vertical axis represents a voltage and a horizontal axis, an elapsed time. In the first embodiment, the input clock signals CK1 and CK2 which are opposite in phase have an amplitude of about 1 V each and a pulse width of about 0.5 micro second each. The threshold voltage Vth of the pair of input transistors is about 3.5 V. The supply voltage VDD is set to about 12 V. As apparently seen from the waveform diagram, the input clock signals CK1 and CK2 are added with the threshold value Vth plus something by the detecting/offsetting circuits 1A and 1B of FIG. 1 respectively. Potential waveforms at input nodes A and B are represented in VA and VB respectively. This level shifting validly drives the input transistors mn1 and mn2, providing the output clock signal Vout pulse-amplified up to a vicinity of the supply voltage VDD. However, when the load transistor mp2 shown in FIG. 1 conducts, a small current flows through the input transistor mn2 connected in series to the load transistor mp2, so that a peak level of the output clock signal Vout presents a voltage drop of Δ V. Practically, however, a level of this voltage drop causes no problem. In the first embodiment of the invention, the voltage of threshold voltage Vth plus something is applied to the input transistor mn2 between source and gate, so that a small current flows through it. As described above, a voltage greater than the threshold value is always applied to the gates of the input transistors, resulting in high-speed level conversion involving no reactive component.

FIGS. 3(a) and 3(b) are circuit diagrams illustrating exemplary embodiments of the current source in the detecting/offsetting circuit 1A of FIG. 1. In the example 3(a), a current source connected to a detecting transistor mnA is composed of a gate-grounded p-channel field-effect type transistor mp3. In the example 3(b), the current source is composed of a high-resistance element.

FIG. 4 is a circuit diagram of the low-amplitude input level converting circuit practiced as a second embodiment of the invention. For ease of understanding, parts common to those of the first embodiment are assigned common reference numerals and symbols. In the second embodiment, the level shifting circuit is composed of a flip-flop circuit instead of the current mirror circuit. That is, a drain of an input transistor mn1 is connected to a gate of an opposite load transistor mp2. A drain of an input transistor mn2 is connected to as gate of an opposite load transistor mp1. When an input clock signal CK1 goes high, the input transistor mn1 conducts and then the load transistor mp2 conducts in response. As a result, a drain of the transistor mp2 is pulled up to a supply voltage VDD side, making an output clock signal Vout1 go high. At this moment, the load transistor mp1 enters a nonconducting state, so that a low-level output clock signal Vout2 appears on an output terminal between the mp1 and the mn1. Then, when the pair of clock signals CK1 and CK2 are inverted, the input transistor mn1 enters a nonconducting state and the input transistor mn2 conducts. As a result, the output clock signal Vout1 falls and the output clock signal Vout2 rises. In the second embodiment, the input transistors are of n-channel type and the load transistors are of p-channel type. It is apparent that the input transistors may be of p-channel type and the load transistors may be of n-channel type. In this case, the supply voltage VDD side and the ground (GND) side need to be replaced. Such a variation is also possible with the first embodiment.

Figure 5:
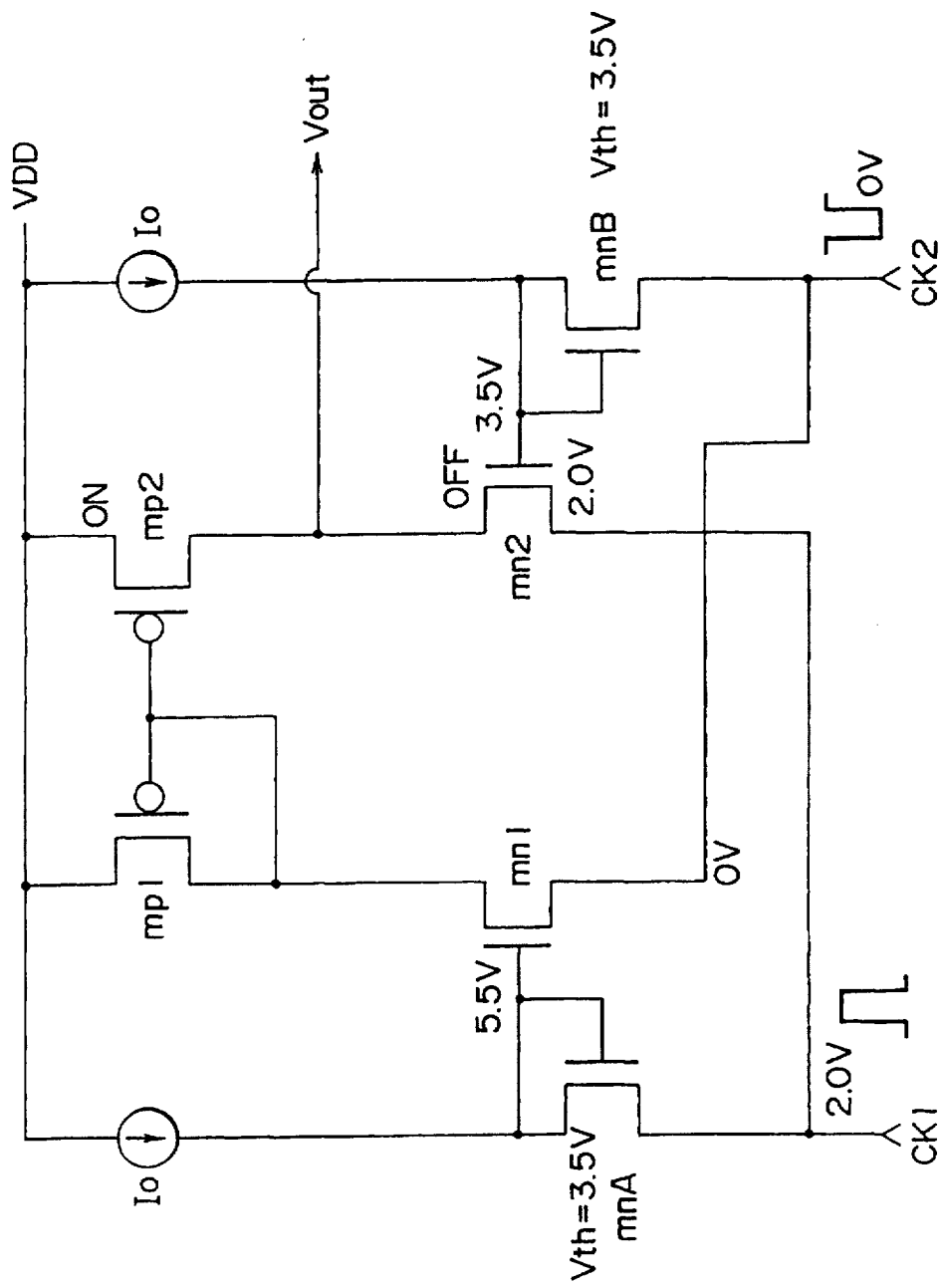
FIG. 5 is a circuit diagram of the low-amplitude input level converting circuit practiced as a third embodiment of the invention.

FIG. 5 is a circuit diagram of the low-amplitude input level converting circuit practiced as a third embodiment of the invention. The third embodiment is a variation to the first embodiment and is intended to suppress a voltage drop Δ V in output clock signal. Basically, the third embodiment has generally the same constitution as that of the first embodiment. Common parts are assigned with common reference symbols for ease of understanding. As shown in FIG. 5, differences lie in that an input clock signal CK2 is supplied to a source of an input transistor mn1 without grounding it, and an input clock signal CK1 is supplied to a source of an input transistor mn2 likewise.

An operation of the third embodiment will be described in detail. In this embodiment, an amplitude of each of the input clock signals CK1 and CK2 which are opposite in phase is set to 2.0 V and a threshold value of each of the input transistors mn1 and mn2 is set to 3.5 V. When the input clock signal CK1 goes high, a gate of the input transistor mn1 is supplied with 5.5 V obtained by adding the threshold value 3.5 V to the amplitude 2.0 V. At this moment, since the clock signal CK2 at low level is on the source of the input transistor mn1, a voltage between source and gate is 5.5 V, causing the input transistor mn1 to conduct. Consequently, a gate of a load transistor mp2 is pulled to 0 V to be turned on, causing the output clock signal Vout to rise on the supply voltage VDD side. At this moment, the source of the input transistor mn2 connected in series to the mp2 is supplied with 2.0 V of the input clock signal CK1 and a gate of the input transistor mn2 is applied with 3.5 V which is equivalent to the threshold voltage. A voltage between source and gate of the input transistor mn2 is 3.5 V-2.0 V=1.5 V, maintaining a completely off state. Consequently, a drain of the load transistor mp2 is pulled up to the supply voltage VDD side substantially completely, causing no substantial voltage drop in the output clock signal Vout.

Figure 6:
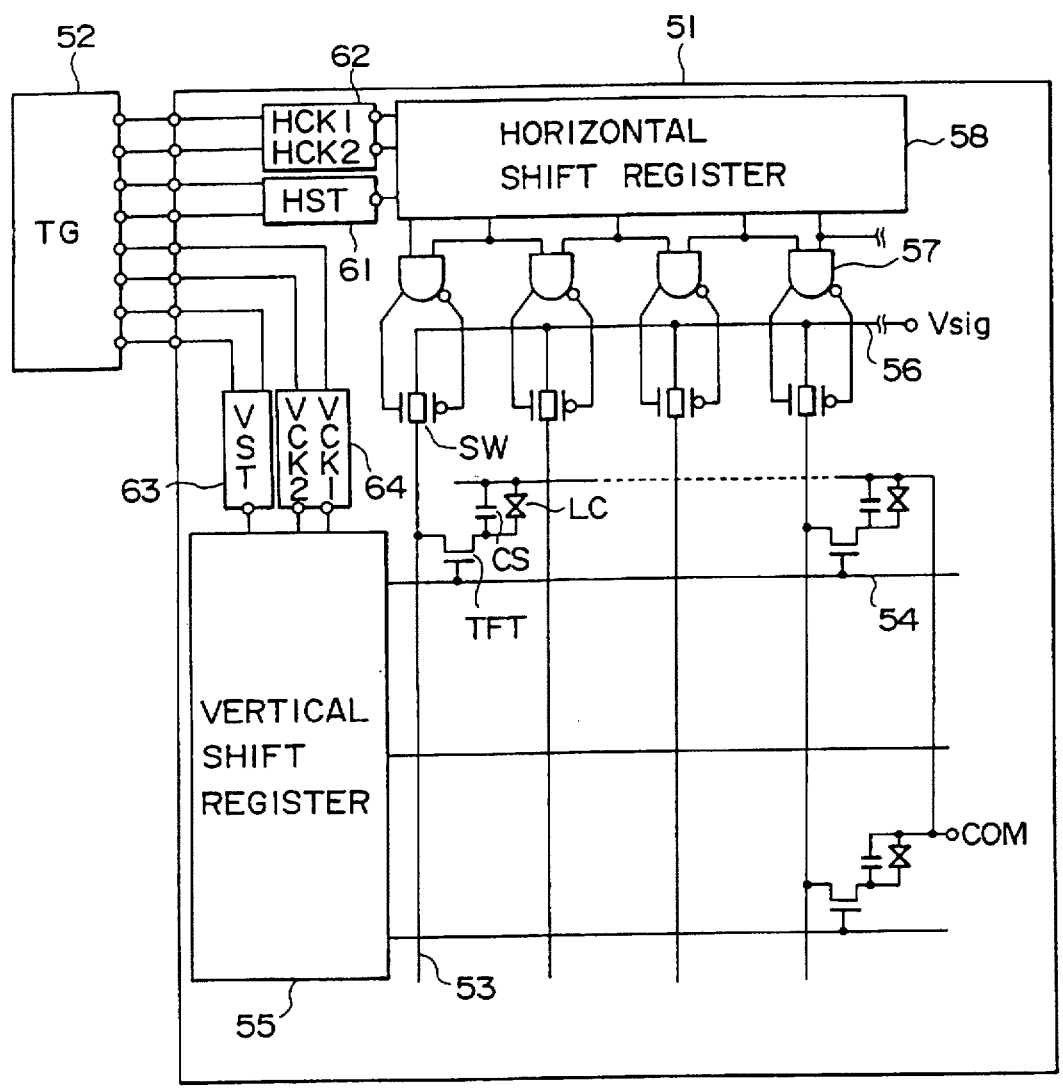
FIG. 6 is a block diagram illustrating an application example of the low-amplitude input level converting circuit of the invention.
Figure 7:
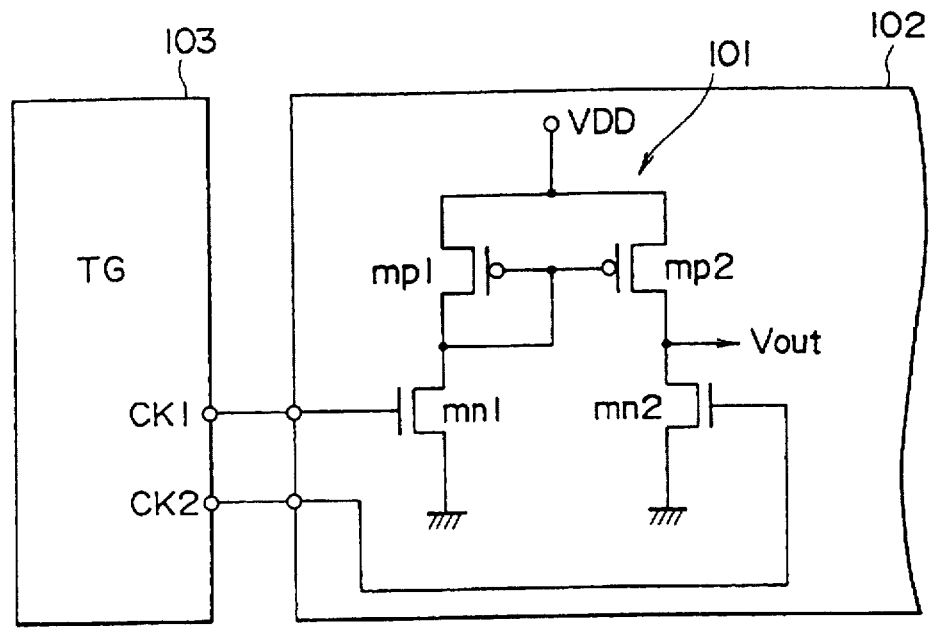
FIG. 7 is a circuit diagram of an example of a conventional level converting circuit.
Figure 8A:
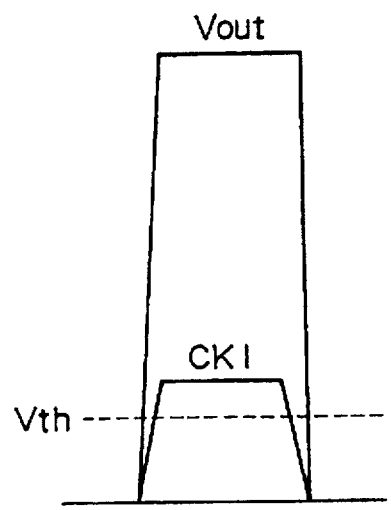
FIGS. 8(a) to 8(b) are waveform diagrams for describing operation of the conventional level converting circuit shown in FIG. 7.
Figure 8B:
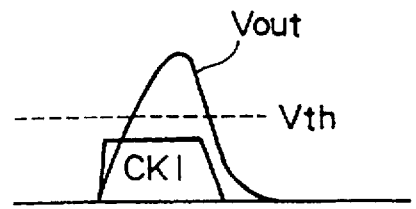
Figure 9:
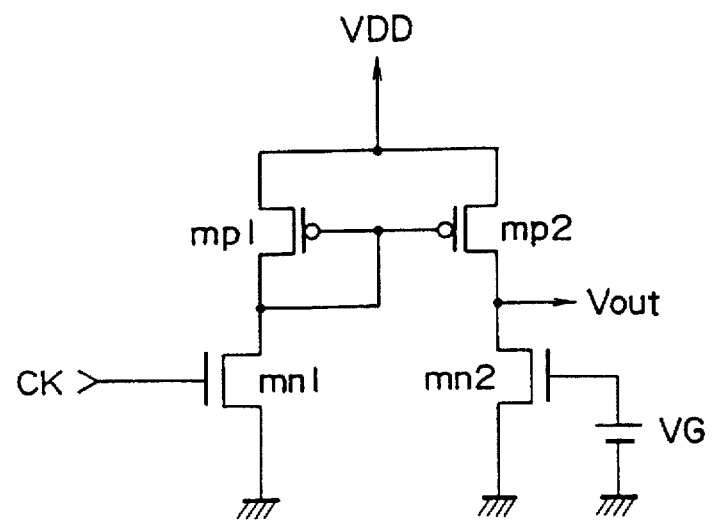
FIG. 9 is a circuit diagram of another example of the conventional level converting circuit.
Figure 10:
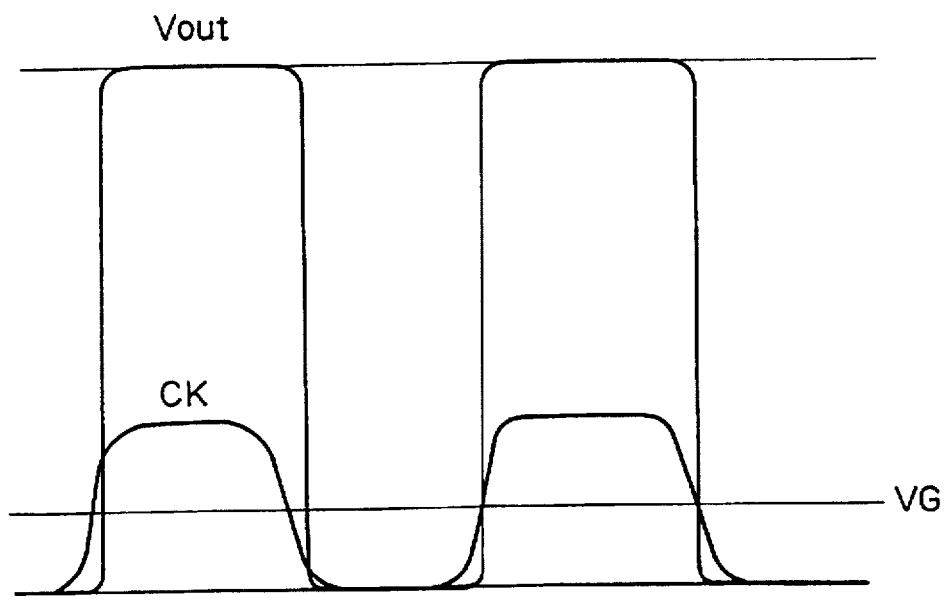
FIG. 10 is a waveform diagram for describing operation of the conventional level converting circuit shown in FIG. 9.

Referring to FIG. 6, an application example of the low-amplitude input level converting circuit according to the invention will be described. In this example, the low-amplitude input level converting circuit is contained in an active-matrix liquid crystal display device 51 to function as clock interface for an external timing generator 52. As shown, the active-matrix liquid crystal display device 51 has an active-matrix display composed of many liquid crystal pixels LC arranged in a matrix, each liquid crystal pixel LC being driven by a thin-film transistor TFT. A load capacity CS is connected to each pixel LC in parallel. A drain of each TFT is connected to a pixel pole providing one end of a corresponding LC. A source of each TFT is connected to one of a plurality of signal lines 53. A gate of each TFT is connected to one of a plurality of gate lines 54. The other end of each LC is connected to an opposite pole COM. The plurality of gate lines 54 is connected to a vertical shift register 55 to receive a select signal from it. The plurality of signal lines 53 is connected each through a sampling switch SW to a common data line 56 to receive an image signal Vsig from it. Each sampling switch SW is connected through a corresponding gate circuit 57 to a horizontal shift register 58. The shift registers 55 and 58 constitute a peripheral drive circuit block.

The vertical shift register 55 sequentially selects the plurality of gate lines 53. The horizontal shift register 58 sequentially makes the sampling switches SW conduct through the corresponding gate circuits 57 to distribute the image signal Vsig to each signal line 53. When one of the gate lines 54 is selected, all thin-film transistors TFT on the selected line conduct simultaneously. Through these conducting transistors, the image signal Vsig sampled from each signal line 53 is written to the corresponding liquid crystal pixel LC. When the selection of the gate line is cleared, the image signal written to the liquid crystal LC is held without change until a next selecting operation.

The horizontal register 58 is activated in response to a horizontal start signal HST and sequentially transfers the horizontal start signal HST in synchronization with horizontal clock signals HCK1 and HCK2 which are opposite in phase to drive the sampling switch SW. The vertical shift register 55 is activated in response to a vertical start signal VST and transfers the vertical start signal VST in synchronization with vertical clock signals VCK1 and VCK2 to sequentially select the plurality of gate lines 54. These horizontal start signal HST, horizontal clock signals HCK1 and HCK2, vertical start signal VST and vertical clock signals VCK1 and VCK2 are internally generated by the above-mentioned low-amplitude input level converting circuits 61 through 64. These converting circuits 61 through 64 each actually have a circuit configuration shown in FIG. 1, FIG. 4 or FIG. 5. However, when generating the pair of horizontal clocks HCK1 and HCK2 or the pair of vertical clock signals VCK1 and VCK2 by using the circuit configuration of FIG. 1 or 5, an inverter is required to internally generate an inverted signal. The above-mentioned low-amplitude input level converting circuits 61 through 64 are each supplied with a two-phase input clock signal having a suitably adjusted period and phase from the external timing generator 52.

Figure 11:
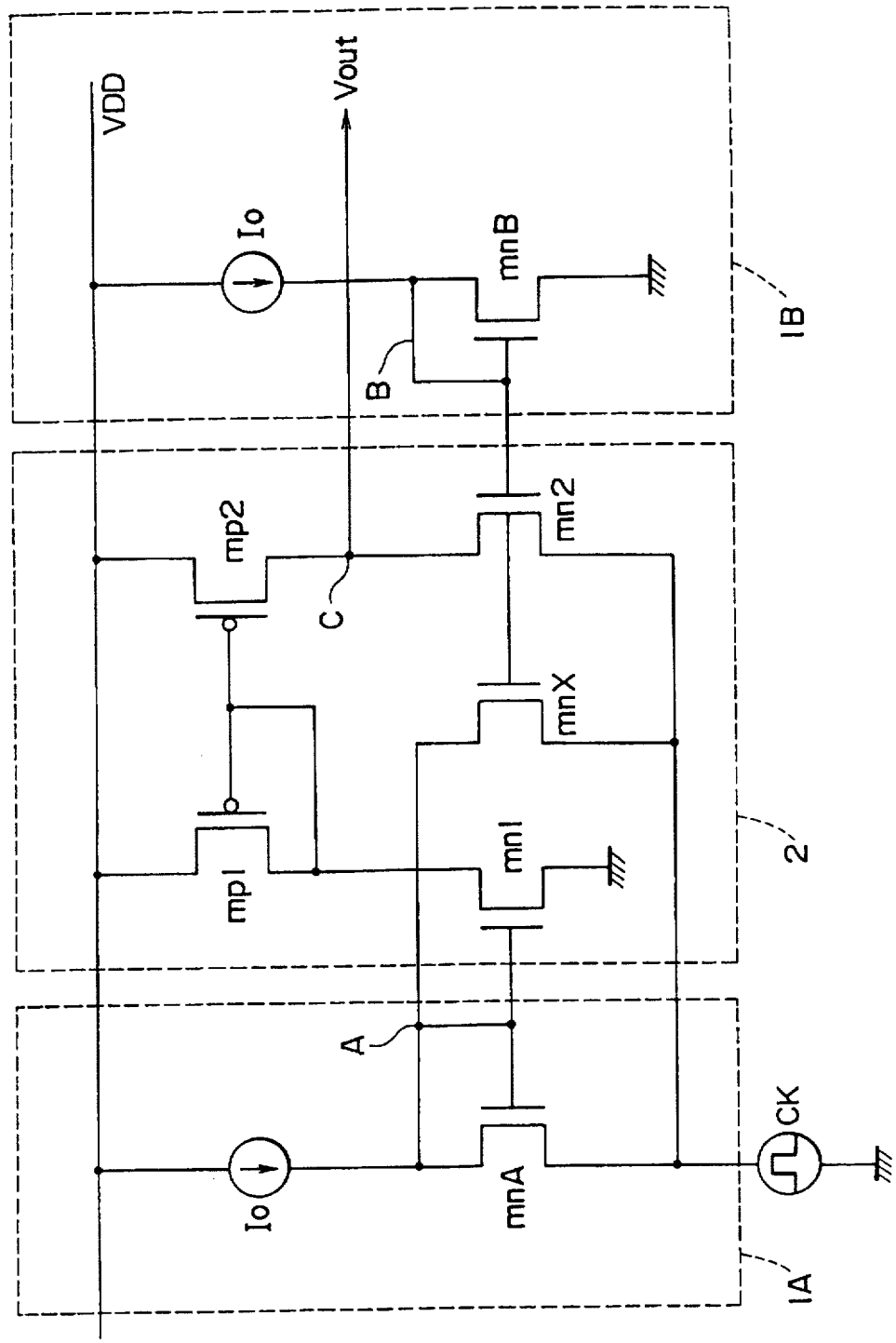
FIG. 11 is a circuit diagram of the low-amplitude input level converting circuit practiced as a fourth embodiment of the invention.

In the application example of FIG. 6, the low-amplitude input level converting circuits 61 through 64 are of two-phase input constitution. Therefore, a total of eight connecting terminals are required between the timing generator 52 and the clock interface composed of the two-phase input level converting circuits 61 through 64. If single-phase input level converting circuits, instead of the two-phase input level converting circuits, are used for the clock interface, the number of the connecting terminals can be reduced by half. Especially, the single-phase input constitution is intrinsically suitable for the level converting circuit 61 which outputs the horizontal start signal HST and the level converting circuit 63 which outputs the vertical start signal VST. In this respect, FIG. 11 shows a single-phase input level converting circuit practiced as a fourth embodiment of the invention. The fourth embodiment is an improvement of the two-phase-input-structured third embodiment of FIG. 5. Therefore, common parts between the embodiments are assigned common reference symbols for ease of understanding. As shown, a single-phase input clock signal CK is supplied to a detecting/offsetting circuit 1A whose constitution is generally the same as that of the detecting/offsetting circuit of FIG. 3. A level shifting circuit 2 is connected between both the detecting/offsetting circuits 1A and 1B. In the fourth embodiment, the level shifting circuit 2 is composed of a differential current mirror circuit. As shown, the level shifting circuit 2 contains a pair of input transistors mn1 and mn2. A gate of the input transistor mn1 is supplied with the single-phase input clock signal CK with a predetermined offset added by the sensing transistor mnA. A gate of the input transistor mn2 is directly applied with the predetermined offset via the detecting transistor mnB. At the same time, this single-phase input clock signal CK is supplied to a source of the input transistor mn2. The level shifting circuit 2 further contains an auxiliary element to lower a driving capacity of the input transistor mn1 below that of the input transistor mn2 when the single-phase input clock signal CK has changed to zero level, thereby stabilizing inversion of an output clock signal Vout. The above-mentioned auxiliary element is composed of an auxiliary transistor mnX of n-channel type. A source of the auxiliary transistor mnX is connected to the source of the input transistor mn2. A drain of the mnX is connected to the gate of the input transistor mn1. A gate of the mnX is commonly connected to the gate of the input transistor mn2.

Referring again to FIG. 11, an operation of the single-phase input level converting circuit will be described in detail. When the single-phase input clock signal CK goes high, the input transistor mn1 conducts via the detecting transistor mnA, pulling a gate voltage of a drive transistor mp2 down to a ground level side. Consequently, the drive transistor mp2 conducts to pull a potential at an output node C up to a supply voltage VDD side, causing the output clock signal Vout to rise. Then, when the single-phase input clock signal CK falls to zero level, a voltage at offset level is applied to the gate of the input transistor mn1. The gate of the input transistor mn2 is always supplied with the voltage of offset level by the detecting transistor mnB. Consequently, since no potential is produced at a differential input of the current mirror circuit constituting the level shifting circuit 2, the potential at the node C becomes unstable or reaches an intermediate level between the supply voltage VDD and a ground potential (GND). To overcome this problem, an auxiliary transistor mnX is incorporated in the differential current mirror circuit to lower a potential at node A sufficiently below a potential at node B when the single-phase input clock signal CK is at zero level. Like the input transistor mn2, this auxiliary transistor mnX is nearly in a cutoff state when the single-phase input clock signal CK is high, so that charging of the output node C is not hampered. On the other hand, when the single-phase input clock signal CK is at zero level, the potential at the node A is lowered to put the detecting transistor mnA, the input transistor mn1, and the load transistors mp1 and mp2 near a cutoff state to improve discharging characteristic of the output node C, thereby stabilizing the state of the output clock signal Vout. Here, it is important, in terms of design considerations, to optimize the size of the auxiliary transistor mnX to a certain degree. For example, if the size is too large, the potential at the node A can be pulled down sufficiently when the single-phase input clock signal CK is at zero level, while when the single-phase input clock signal CK is at high level a leak current of the auxiliary transistor mnX prevents the potential at the node A from rising sufficiently, thereby posing the risk of adversely affecting the charging characteristic of the output node C.

FIG. 12 shows a further particularization of the circuit constitution of the fourth embodiment of FIG. 11. In this particular example, the supply voltage VDD is set to 12 V. A current mirror constitution composed of transistors mp3, mp5, and mn6 is used as a current source for a detecting transistor mnA. Especially, the transistor mn6 is used as a high-resistance element for current control. Likewise, a current mirror constitution composed of transistors mp4, mp5 and mn6 is used as a current source for a detecting transistor mnB. An output node C is connected with a load capacity via an inverter composed of a pair of transistors mp7 and mn7. This inverter functions as an output buffer.

FIGS. 13(1) and 13(2) indicate results of a simulation performed on the single-phase input level converting circuit of FIG. 12. In the figure, FIG. 13(1) indicates a simulation result obtained when the single-phase input clock signal CK having an amplitude of 5 V is supplied. A pulse width of the input clock signal CK is about 200 ns. The output clock signal Vout rises sufficiently near the supply voltage level in response to the input clock signal CK. To the load capacity, an inverted output voltage VLD is applied. FIG. 13(2) indicates a simulation result obtained when the amplitude of the single-phase clock signal CK has been lowered to 3 V. As compared with the result of FIG. 13 (1), generally equally excellent output clock signal Vout and output voltage VLD are obtained.

As described and according to the invention, an input clock signal having a low amplitude is internally offset to a suitable level and then a pulse-amplitude level conversion is performed to perform clock interfacing of a thin-film transistor integrated circuit device represented by an active-matrix liquid crystal display device at a relatively high speed at a low voltage below 3 V for example. This allows to fully cope with a recent trend of ever reducing operating voltage of CMOS gate array constituting an external timing generator, eliminating necessity for building a pulse amplifier based especially on high dielectric-strength MOS process into the gate array to eventually reduce size of the chip. Further, direct connection to the CMOS gate array enhances product attractiveness of an active-matrix liquid crystal display kit. Additionally, according to the invention, a simple setup of adding an auxiliary element to a two-phase-input level converting circuit allows to convert the two-phase system into a single-phase system, providing stable and high-speed pulse amplification. Use of the single-phase-input level converting circuit easily implements level conversion of a single-phase signal such as a shift register start pulse. Further, use of the single-phase-input level converting circuit as clock interface reduces the number of connecting terminals as compared with the prior-art technique.

While the preferred embodiments of the invention have been described using specific terms, such description is for illustrative purposes only, and it is to be understood that changes and variations may be made without departing from the spirit or scope of the appended claims.

What is claimed is:

1. A level converting circuit for converting a digital input signal from a first level to a second level, said circuit comprising:

a level converting means for converting the digital input signal having at least a first phase of a relatively low first amplitude to a digital output signal having a relatively high amplitude with respect to the digital input signal, said output signal having a same logical state as the first phase of the input signal, said level converting means comprising a first input transistor having a threshold voltage; and a detecting/offsetting means for detecting the threshold voltage of the first input transistor and adding an offset voltage based on the detected threshold voltage to the first phase of the digital input signal to create an offset digital input signal and applying the offset input signal to a gate of said first input transistor of the level converting means, wherein said level converting means further comprises a second input transistor which receives the second phase of the input signal which is opposite in phase to the first phase of the digital input signal.

2. The level converting circuit of claim 1, wherein said level converting means comprises a current mirror circuit.

3. The level converting circuit of claim 1, wherein said level converting means comprises a flip-flop circuit.

4. A level converting circuit for converting a single-phase digital input signal of a first amplitude, said circuit comprising:

a level converting means for converting the single-phase digital input signal to a digital output signal having a relatively high amplitude with respect to the single-phase digital input signal, said level converting means further comprising first and second input transistors, said first input transistor having a threshold voltage, wherein the single-phase digital input signal is applied to the first input transistor; and a detecting/offsetting means connected to a gate of the first input transistor of the level converting means, said detecting/offsetting means detecting the threshold of the first input transistor and adding an offset voltage based on the detected threshold voltage to the single-phase digital input signal to create an offset single-phase digital input signal which is applied to the gate of the first input transistor and wherein a fixed offset voltage is applied to a gate of the second input transistor.

5. The level converting circuit of claim 4, further comprising an auxiliary element for lowering a driving power of said first input transistor to a level lower than that of said second input transistor when the single phase input signal changes to a substantially zero level.

6. The level converting circuit of claim 5 wherein said auxiliary element comprises an auxiliary transistor, a source of said auxiliary transistor being connected to a source of said second input transistor, a drain of said auxiliary transistor being connected to the gate of said first input transistor, a gate of said auxiliary transistor being connected to the gate of said second input transistor.

7. A level converting circuit for converting a digital input signal from a first level to a second level, said circuit comprising:

a level converting means for converting the digital input signal having at least a first phase of a relatively low first amplitude to a digital output signal having a relatively high amplitude with respect to the digital input signal, said output signal having a same logical state as the first phase of the input signal, said level converting means comprising a first input transistor having a threshold voltage; and a detecting/offsetting means for detecting the threshold voltage of the first input transistor and adding an offset voltage based on the detected threshold voltage to the first phase of the digital input signal to create an offset digital input signal and applying the offset input signal to a gate of said first input transistor of the level converting means, wherein the level converting means further comprises a second input transistor connected to a second phase of the digital input signal.

8. The level converting circuit of claim 7, wherein the second phase is applied to a source of the first input transistor and wherein the first phase of the digital input is applied to a source of the second input transistor.

9. The level converting circuit of claim 7, wherein another offset voltage is exclusively applied to a gate of the second input transistor and further wherein the first phase of the digital input signal is applied to the source of the second input transistor.

10. The level converting circuit of claim 9, further comprising an auxiliary transistor having a gate connected to a gate of the second input transistor and wherein a source of the second input transistor is connected to a source of the auxiliary transistor.

* * * * *